(12) United States Patent
Chakour et al.

(10) Patent No.: US 11,731,285 B2
(45) Date of Patent: Aug. 22, 2023

(54) APPARATUS PROVIDED WITH A CAPACITIVE DETECTION AND ELECTRIC LINE(S) IN THE CAPACITIVE DETECTION ZONE

(71) Applicant: FOGALE SENSORS, Nîmes (FR)

(72) Inventors: Yacine Chakour, Sernhac (FR); Didier Roziere, Nîmes (FR); Alain Courteville, Congenies (FR)

(73) Assignee: FOGALE SENSORS, Nîmes (FR)

( * ) Notice: Subject to any disclaimer, the term of this patent is extended or adjusted under 35 U.S.C. 154(b) by 324 days.

(21) Appl. No.: 17/256,776

(22) PCT Filed: Jul. 4, 2019

(86) PCT No.: PCT/EP2019/067949
§ 371 (c)(1),
(2) Date: Dec. 29, 2020

(87) PCT Pub. No.: WO2020/011633
PCT Pub. Date: Jan. 16, 2020

(65) Prior Publication Data
US 2021/0154860 A1    May 27, 2021

(30) Foreign Application Priority Data
Jul. 13, 2018    (FR) ...................................... 1856484

(51) Int. Cl.
*B25J 13/08*    (2006.01)
*B25J 19/00*    (2006.01)
(Continued)

(52) U.S. Cl.
CPC ......... *B25J 13/086* (2013.01); *B25J 19/0025* (2013.01); *G01R 27/2605* (2013.01);
(Continued)

(58) Field of Classification Search
CPC .... B25J 13/086; B25J 19/0025; B25J 9/1676; B25J 19/06; G01V 3/088; H03K 17/955;
(Continued)

(56) References Cited

U.S. PATENT DOCUMENTS 5,166,679 A    11/1992   Vranish et al.
8,692,565 B2 *  4/2014   Togura ................. H03K 17/955
                                                          324/600
(Continued)

FOREIGN PATENT DOCUMENTS

JP    H042420 U    1/1992

OTHER PUBLICATIONS

French Search Report Received in French Application No. 1856484 completed May 21, 2019.
(Continued)

*Primary Examiner* — Amy He
(74) *Attorney, Agent, or Firm* — Greer, Burns & Crain, Ltd

(57) ABSTRACT

An appliance includes:
- at least one measurement electrode, for detecting at least one object in a detection zone, by detecting a signal with respect to a coupling capacitance between the object and said the at least one measurement electrode;
- at least one capacitive detection electronics, connected to the at least one measurement electrode, and
- an electric line, having at least one electric wire, in the detection zone;

the appliance also including a signal conditioner, applying to at least a portion of the electric line, an alternating electrical potential ($V_G$), called guard potential, identical to the detection potential at the detection frequency. The appliance can
(Continued)

be a robot, in particular a robotized arm, equipped with an electric line providing a power supply to a component part of the robot.

15 Claims, 3 Drawing Sheets

(51) Int. Cl.
  *G01V 3/08* (2006.01)
  *H03K 17/955* (2006.01)
  *G01R 27/26* (2006.01)
  *B25J 9/16* (2006.01)

(52) U.S. Cl.
  CPC ........... *G01V 3/088* (2013.01); *H03K 17/955* (2013.01); *B25J 9/1676* (2013.01)

(58) Field of Classification Search
  CPC ........ H03K 2217/94026; H03K 2217/960705; G01R 27/2605
  See application file for complete search history.

(56) References Cited

U.S. PATENT DOCUMENTS

2013/0293245 A1* 11/2013 Kuhnen ................... B60J 5/107
  296/146.1
2014/0173986 A1* 6/2014 Van Gastel ........ G07C 9/00309
  49/31
2019/0286261 A1 9/2019 Neel et al.

OTHER PUBLICATIONS

International Search Report and Written Opinion Received in PCT/EP2019/067949 dated Aug. 20, 2019.

* cited by examiner

APPARATUS PROVIDED WITH A CAPACITIVE DETECTION AND ELECTRIC LINE(S) IN THE CAPACITIVE DETECTION ZONE

BACKGROUND

The present invention relates to an appliance, such as a robot, equipped with capacitive detection of object(s) and at least one electric line in the capacitive detection zone.

The field of the invention is non-limitatively that of the field of robotics, in particular the field of industrial robotics or service robots, for example medical or domestic, or also collaborative robots, also called "cobots".

In the field of collaborative robotics, the robots can be equipped with capacitive sensors in order to detect the approach of objects or human operators in the vicinity of said robot. These sensors can for example comprise capacitive electrodes arranged in the form of sensitive surfaces that cover the surface of the robot at least partially. These capacitive electrodes are polarized at an alternating excitation potential, and connected to detection electronics that measures the capacitive coupling between these electrodes and objects polarized at a potential different from the electrodes, most usually ground.

These robots are generally equipped with tools or accessories, referenced to ground, and connected to control electronics or electric power supplies by electric cables that pass the length of the robot in cable runs.

When these cables are in proximity to a surface of capacitive sensors, they may be detected as obstacles and mistakenly trigger safety procedures. These cables can also interfere with the operation of the capacitive sensors in terms of accuracy and detection reach.

SUMMARY

A purpose of the present invention is to overcome these drawbacks.

Another purpose of the invention is to propose a solution allowing the passage of a cable polarized at a potential different from the potential of a capacitive sensor, in proximity to said capacitive sensor, without interfering with the operation of said capacitive sensor.

It is also a purpose of the present invention to propose a solution allowing the passage of a cable polarized at a potential different from the potential of a capacitive sensor, in proximity to said capacitive sensor, without being detected by this sensor.

At least one of these purposes is achieved with an appliance comprising:
 at least one electrode, called measurement electrode, polarized at an alternating electrical potential, called detection electrical potential, different from a ground potential, at a frequency, called detection frequency, in order to detect at least one object in a detection zone,
 at least one capacitive detection electronics, connected to said measurement electrodes, in order to detect a signal with respect to a coupling capacitance between said object and said measurement electrode, and
 an electric line comprising at least one electric wire, in said detection zone;
said appliance also comprising a signal conditioner, applying, to at least a portion of said electric line, an alternating electrical potential, called guard potential, identical to said detection potential at said detection frequency.

Thus, the appliance according to the invention proposes to set at least a portion of the electric line at a guard potential identical to the detection potential polarizing the measurement electrodes at the detection frequency. In so doing, all the portion of the electric line polarized at the guard potential becomes electrically invisible to the measurement electrodes. Thus, the electric line does not interfere with the capacitive detection equipping the appliance, and does not cause mistaken or unwarranted detections that could mistakenly trigger safety procedures.

As a result, thanks to the present invention, it becomes possible to use effective capacitive detection in an appliance, while still positioning an electric line in the capacitive detection zone in order to convey a signal for electric power supply, control, monitoring and/or communication, to/from a component part of said appliance, or another appliance.

In the present application, two alternating potentials are identical at a given frequency when they each comprise an identical or similar alternating component at said frequency; i.e. having the same amplitude (for example plus or minus a few percentage points) and the same phase (for example plus or minus a few degrees). Thus, the at least one of the two potentials identical at said frequency can also comprise a continuous component, and/or an alternating component having a frequency different from said given frequency.

Similarly, two alternating potentials are different at the given frequency when they do not have an identical or similar alternating component at this given frequency.

In the present application, the term "ground potential" or "general ground potential" denotes a reference potential of the electronics, of the robot or of its environment, which can be for example an electrical earth or a ground potential. This ground potential can correspond to an earth potential or to another potential, connected or not to the earth potential.

Furthermore it is noted that generally, objects which are not in direct electrical contact with a particular electrical potential (electrically floating objects) tend to be polarized by capacitive coupling at the electrical potential of other objects present in their environment, such as for example earth or electrodes, if the surfaces of overlap between these objects and those of the environment (or the electrodes) are sufficiently large.

In the present application, by "object" is meant any object or any person that may be located within the environment of the robot.

The electric line can comprise at least one shielding layer around at least one electric wire on at least a portion of said electric line.

In this case, the signal conditioner can apply the guard potential to said shielding layer.

Thus, each electric wire that is surrounded by the shielding layer is electrically guarded by the guard layer and does not interfere with the capacitive detection, while still conveying any electrical potential.

According to a first non-limitative embodiment, the shielding layer can be provided in a cable comprising the at least one electric wire.

In this case, the shielding layer is firmly fixed to the cable and forms part of the cable. It therefore cannot be removed from the cable without damaging the cable.

Cables with a shielding layer currently exist, for example used as an electromagnetic shield screen. The invention proposes to use this existing shielding layer as guard layer, by polarizing this shielding layer at the guard potential: which is simple, quick and does not require modification of the existing cables.

According to a usual configuration of the cables, the shielding layer can also be protected on the outside by an electrically insulating layer in order to avoid short-circuits, in particular to ground.

According to another non-limitative embodiment, the shielding layer can be provided in, or may be formed by, a cable sleeve independent of the at least one electric wire, and through which the at least one electric wire is passed.

In this case, the shielding layer is independent of the electric wires, or the cable, forming the electric line. In other words, the shielding layer can be removed from the electric wires, or from the electric cable, without damaging them (it).

Cable sleeves or cable sheaths equipped with or forming a shielding layer used as an electromagnetic shield screen, currently exist. Cable sleeves or cable sheaths also exist with a corrugated metallic cover producing a mechanical shielding in order to protect the electric wires or the cables from crushing and tearing. The invention proposes to use such a cable sleeve as guard layer, by polarizing the shielding layer of said cable sleeve at the guard potential: which is simple, quick and does not require modification of the existing electric cables or wires used, or of the cable sleeves.

Moreover, the cable sleeve or the sheath can advantageously comprise an electrically insulating layer on the shielding layer, in order to avoid short-circuits, in particular to ground.

The shielding layer can for example be in the form of braided wires forming a shielding braid.

The braid can be produced with a wire, or with several wires, that are electrically conductive.

The shielding layer can have the form of a continuous conductive layer, such as a layer of copper or aluminium for example, or a corrugated stainless steel wall.

According to a non-limitative embodiment, the signal conditioner can comprise a transformer inducing the guard potential on the shielding layer, by mutual inductance.

In this case, the transformer can comprise a primary induction coil that is electromagnetically coupled with at least one secondary coil in series with the shielding layer.

The primary and secondary coils can for example be wound on a common ferromagnetic core, increasing the coupling between said coils. Thus, by setting the primary coil at the guard potential or at a potential proportional to the guard potential in order to take account of the coupling between the coils, the guard potential is obtained by mutual inductance at the terminals of the secondary coil connected to the shielding layer: the shielding layer is then set to the guard potential.

According to another embodiment, the signal conditioner can comprise at least one electrical contact with the shielding layer in order to polarize said shielding layer at the guard potential.

This at least one electrical contact can connect the guard layer to a source delivering the guard potential.

Alternatively, or in addition, the signal conditioner can apply the guard potential to at least one, in particular each, electric wire of the electric line.

In this case, the or each electric wire is at the guard potential. In other words, the or each electric wire can convey one or more potentials, one of which corresponds to the guard potential.

Thus, at the detection frequency of the capacitive electronics, each electric wire becomes electrically "invisible" to the measurement electrodes carrying out the capacitive detection.

The electric line can comprise concentric electric wires, so that one or more electric wires are arranged in another wire, called outer wire, which surrounds them.

In this case, the signal conditioner can apply the guard potential to the outer wire only.

In this case, said outer wire electrically guards the other electric wire or wires that are concentrically arranged in said outer wire. It is therefore not necessary to set the wires located in the outer wire at the guard potential.

According to an embodiment, the signal conditioner can comprise, for at least one, in particular each, electric wire, a transformer inducing the guard potential on said electric wire, by mutual inductance.

In this case, the transformer can comprise a primary induction coil that is electromagnetically coupled with at least one secondary coil in series with the electric wire.

The primary and secondary coils can for example be wound on a common ferromagnetic core, increasing the coupling between said coils.

Thus, by setting the primary coil at the guard potential or at a potential proportional to the guard potential in order to take account of the coupling between the coils, the guard potential is obtained by mutual inductance at the terminals of the secondary coil connected to the electric wire: the electric wire is then set to the guard potential at the detection frequency.

The appliance according to the invention can also comprise at least one electrode, called guard electrode, polarized at the guard potential, and arranged on the side opposite to the detection zone with respect to the at least one measurement electrode.

Such an at least one guard electrode makes it possible to electrically guard the at least one measurement electrode, and avoid it being interfered with by other surfaces/component parts of the appliance, and having a potential different from the detection potential.

According to an advantageous characteristic, the electric line can comprise at least one capacitive measurement electrode polarized at the detection potential, arranged on the outside with respect to the portion of said electric line polarized at the guard potential, and isolated from said portion polarized at the guard potential.

Thus, the electric line participates in the capacitive detection.

The appliance according to the invention thus makes it possible to avoid collisions between said electric line and surrounding objects.

The at least one measurement electrode can be arranged on an outer surface of the electric line, isolated from the rest of the electric line. This outer surface can be an outer surface of a cable sleeve when the electric line has one. The outer surface can be an outer surface of a cable forming the electric line.

The electric line can be an electric power supply line for, and/or for communication with, an electric component part of said appliance.

The capacitive detection implemented in the appliance according to the invention is based on the measurement/detection of a capacitive coupling signal between at least one measurement electrode and the object to be detected.

To this end, the capacitive detection electronics can comprise digital and/or analogue electronics for, on one hand:

supplying the detection potential and the guard potential, at the detection frequency;

measuring/detecting a signal with respect to the electrode-object coupling.

According to an embodiment, the detection electronics can comprise an operational amplifier (OA), or a circuit producing an operational amplifier, functioning as a transimpedance or charge amplifier, in which:

- a first input, for example an inverting input, is connected to one or more measurement electrodes, directly or via a polling means for example;
- a second input, for example a non-inverting input, is connected to an oscillator supplying the detection potential and the guard potential; and
- the output is looped on said first input via an impedance, and in particular via a capacitor.

In this configuration, the output of the OA supplies a voltage $V_s$, the amplitude of which is proportional to the electrode-object capacitance between at least one measurement electrode and the object.

The output of the operational amplifier can be connected, directly or indirectly, to a module for measuring the voltage $V_s$. This module for measuring the voltage $V_s$ can comprise a signal conditioner, a demodulation such as a synchronous demodulation at the detection frequency, or an amplitude detection.

The detection electronics can also comprise an oscillator supplying the alternating detection potential at the detection frequency and the guard potential.

This detection potential can comprise a sinusoidal or square signal, or any other wave shape. The detection frequency can correspond to the fundamental frequency of this wave shape.

Advantageously, the detection electronics can be at least partially electrically referenced to the detection potential.

The appliance according to the invention can have the form of a robot.

According to non-limitative embodiments, the robot can be or comprise any robotized system. It can in particular have the form of, or comprise, a robotized arm.

The robot can also be or comprise for example a mobile robot, a vehicle on wheels or tracks such as a truck equipped with an arm or a handling system, or a robot of the humanoid, gynoid, or android type, optionally provided with movement component parts such as limbs.

BRIEF DESCRIPTION OF THE DRAWINGS

Other advantages and characteristics will become apparent on examination of the detailed description of non-limitative examples and from the attached drawings in which.

DETAILED DESCRIPTION

It is well understood that the embodiments that will be described hereinafter are in no way limitative. In particular, variants of the invention may be envisaged comprising only a selection of characteristics described hereinafter, in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described may be combined together if there is no objection to such combination from a technical point of view.

In the figures, elements that are common to several figures retain the same reference.

Figure 1:
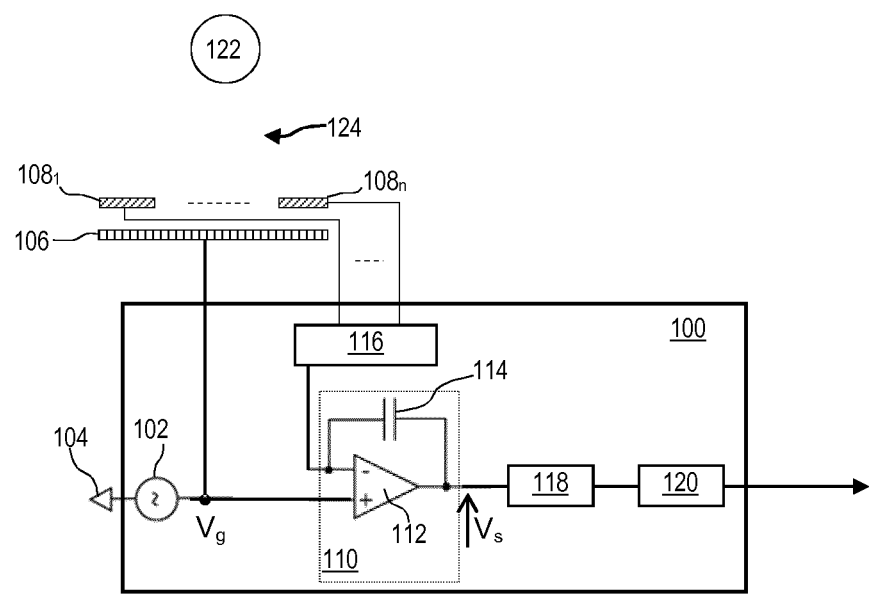
FIG. 1 is a diagrammatic representation of a non-limitative embodiment of capacitive detection electronics that can be utilized in the device according to the invention.

FIG. 1 is a diagrammatic representation of a non-limitative embodiment of capacitive detection electronics that can be utilized in the device according to the invention.

The detection electronics 100, shown in FIG. 1, can be produced in an analogue or digital form, or an analogue/digital combination.

The detection electronics 100 comprises an oscillator 102 delivering an alternating voltage, denoted $V_G$, and referenced to a ground potential 104.

The voltage $V_G$ is used as guard potential in order to polarize one or more guard electrodes 106 via a line or several lines, and as excitation or detection potential in order to polarize measurement electrodes $108_1$-$108_n$, which may also be denoted by the reference 108, or the reference $108_i$, hereinafter. It thus comprises at least one spectral component at the detection frequency used by the capacitive detection electronics.

The detection electronics 100 comprises a current, or charge, amplifier 110 represented by an operational amplifier (OA) 112 and a feedback capacitor 114 looping the output of the OA 112 at the inverting "−" input of the OA 112.

In addition, in the example shown, the non-inverting "+" input of the OA 112 receives the voltage $V_G$ and the "−" inverting input of the OA 112 is provided in order to be connected to each measurement electrode $108_i$ via a polling means 116, which can be for example a switch, so as to poll the measurement electrodes 108 individually in turn.

Use of the polling means 116 is of course optional.

Under these conditions, the charge amplifier 110, and in particular the OA 112, supplies at the output a voltage $V_s$ at the frequency of detection and amplitude proportional to the coupling capacitance $C_{eo}$, called electrode-object capacitance, between one or more measurement electrodes 108 connected at the "−" input thereof and an object in proximity, or in contact, with said measurement electrode 108.

The detection electronics 100 can also comprise a signal conditioner 118 making it possible to obtain a signal representative of the sought coupling capacitance $C_{eo}$. This signal conditioner 118 can comprise for example a synchronous demodulator for demodulating the signal with respect to a carrier, at the detection frequency. The signal conditioner 118 can also comprise an asynchronous demodulator or an amplitude detector. This signal conditioner 118 can of course be produced in an analogue and/or digital form (microprocessor), and comprise all necessary means for filtering, conversion, processing, etc.

The signal conditioner 118 measures and supplies the value of the voltage $V_s$.

The detection electronics 100 can also comprise a calculation module 120 arranged in order to determine a distance or an item of distance information, and/or a contact or an item of contact information, between at least one measurement electrode 108 and the object, as a function of the signal with respect to the coupling capacitance $C_{eo}$ originating from the signal conditioner 118.

This calculation module 120 can for example comprise or be produced in the form of a microcontroller, or an FPGA.

The calculation module 120 can also supply other items of information, such as triggering of alarms or safety procedures, when for example the measured distances are less than predetermined distance thresholds.

Of course, the detection electronics 100 can comprise components other than those described.

The detection electronics 100, or at least its sensitive part with the charge amplifier 110, can be referenced (or supplied by electrical power supplies referenced) to the guard potential $V_G$, in order to minimize the parasitic capacitances.

The detection electronics 100 can also be referenced, more conventionally, to the ground potential 104.

Thus, when an object 122 enters the detection zone 124 of the measurement electrode or electrodes $108_1$-$108_n$, this object 122 enters into capacitive coupling with at least one measurement electrode 108, which modifies the capacitance seen by this measurement electrode 108, and therefore the amplitude of the voltage $V_s$ measured by the measurement electronics 100 connected to this measurement electrode 108.

Figure 2:
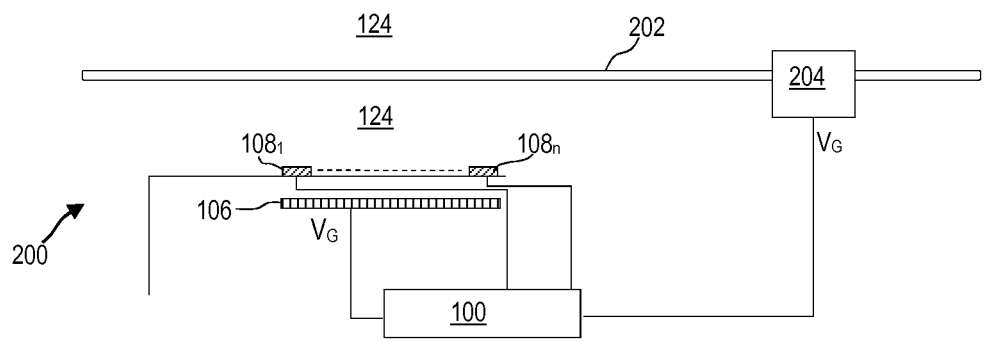
FIG. 2 is a partial diagrammatic representation of a non-limitative embodiment of an appliance according to the invention.

FIG. 2 is a partial diagrammatic representation of a non-limitative embodiment of an appliance according to the invention.

The appliance 200, shown in FIG. 2, comprises the measurement electrodes $108_1$-$108_n$, the guard electrode or electrodes 106, as well as the detection electronics 100. The measurement electrodes $108_1$-$108_n$, respectively the guard electrode or electrodes 106, can be arranged, for example, on/in an outer wall of the appliance 200. In particular, the electrodes 106-108 can be arranged, for example, on/in a rigid or flexible case of the appliance 200, or in a layer, or a skin, mounted on a portion of the appliance 200.

The appliance 200 can also comprise an electric line 202 located in the detection zone 124 of the measurement electrodes $108_1$-$108_n$, on the side opposite to the at least one guard electrode 106. This electric line 202 can comprise one or more electric wires, or electric cables, used in order to convey an electrical signal for an electric power supply of, or for communication with, a component part of the appliance 200.

The appliance 200 also comprises a signal conditioner 204, applying the guard potential $V_G$ to at least a portion of said electric line 202. Thus, the electric line 202 is not seen by the measurement electrodes $108_1$-$108_n$ and does not interfere with the capacitive detection carried out by these measurement electrodes $108_1$-$108_n$.

Figure 3:
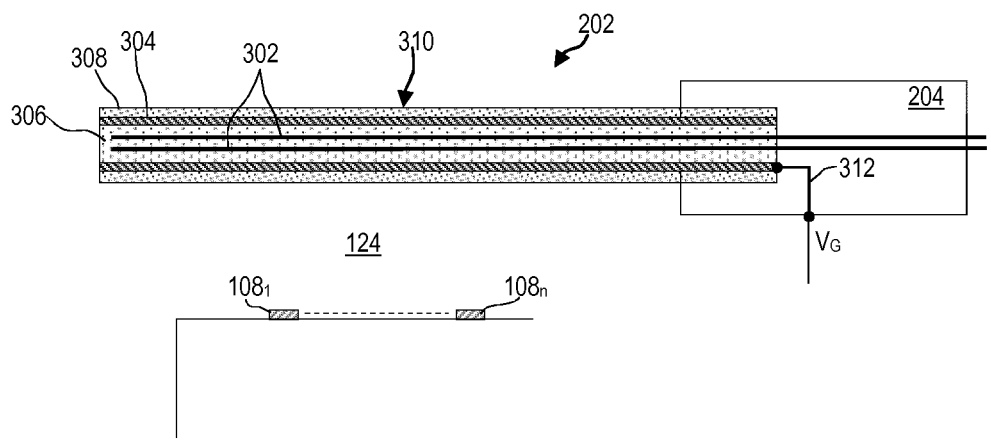
FIGS. 3-5 are diagrammatic representations of embodiments for setting an electric line at the guard potential in an appliance according to the invention.

FIG. 3 is a diagrammatic representation of a first embodiment of setting an electric line at the guard potential in an appliance according to the invention.

In the example shown in FIG. 3, the line 202 comprises one or more electric wires 302 used for conveying electrical signals, for example in order to supply an electrical component part or in order to communicate with an electrical or electronic component part.

The electric line 202 comprises a shielding layer 304, arranged around the electric wires 302. The shielding layer 304 can be produced by braided electric wires, or by a thin layer of an electrically conductive material such as copper or aluminium for example.

The conductive shielding layer 304 is separated from each of the electric wires by an insulator 306. It is itself covered with an insulating layer 308 in order to avoid all electrical contact with the environment, except in the signal conditioner.

In the example shown in FIG. 3, the electrical wires 302 and the shielding layer 304, the insulators 306-308 form part of one and the same cable 310 in the form of a single-piece unit. In other words, the shielding layer 304 is one of the constituent parts of the cable 310 and cannot be separated from the wires 302 without damaging the cable 310.

The signal conditioner 204 comprises a line, or an interface, 312 connected by an electrical connection to the shielding layer 304. This line 312 takes the voltage $V_G$ received by the signal conditioner 204 to the shielding layer 304, so that said shielding layer 304 is polarized at said guard potential $V_G$.

Thus, the electric wires 302, surrounded by the shielding layer 304, are guarded at the guard potential $V_G$ and cannot be seen by the measurement electrodes $108_1$-$108_n$.

In the example shown, the shielding layer 304 is present on the electric line 202 only on one side of the signal conditioner 204, at the output of this signal conditioner. It can of course also be present on the electric line 202 on the other side of the signal conditioner, at the input. In this case, it can be:
either also connected to the guard potential $V_G$;
or connected to another potential such as ground, or electrically floating, in which case it is interrupted electrically at the level of the signal conditioner 204 between the input and the output.

Optionally, the electric line 202 can comprise one or more measurement electrodes arranged on the outer surface of the cable 310 and connected to capacitive detection electronics.

Figure 4:
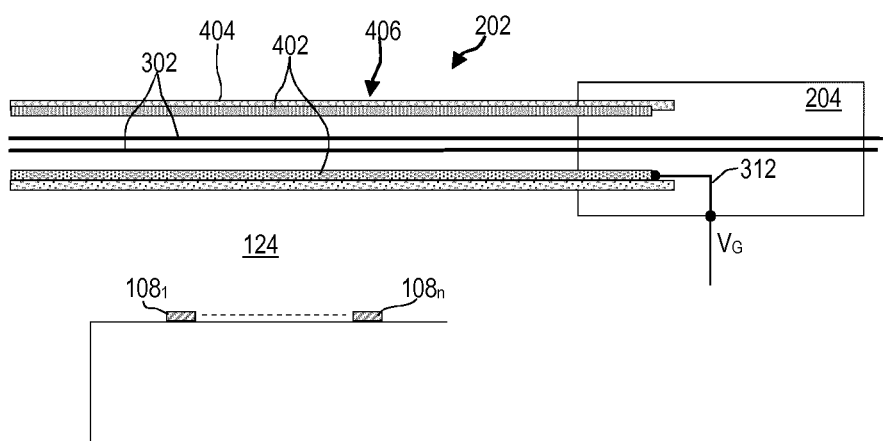

FIG. 4 is a diagrammatic representation of a second embodiment of setting an electric line at the guard potential in an appliance according to the invention.

In the example shown in FIG. 4, the line 202 comprises the electric wires 302 used for conveying electrical signals, for example in order to supply an electrical component part or in order to communicate with an electrical or electronic component part.

The electric line 202 comprises an electrically conductive shielding layer 402, included within a cable sleeve sheath arranged around the electric wires 302. The shielding layer 402 can be produced in particular by the metallic wall of a corrugated metallic cable sleeve sheath, produced with a spiral metallic strip, or by a shielding layer of the cable sleeve sheath, with braided electric wires, or a thin layer of an electrically conductive material such as copper or aluminium for example.

The conductive shielding layer 402 can be covered with an electrically insulating layer 404 in order to avoid all electrical contact with the environment, except in the signal conditioner.

In the example shown in FIG. 4, the shielding layer 402 is part of, or forms, a cable sleeve 406. In other words, the shielding layer 402 is independent of the wires 302, and can be produced and installed independently of the wires 302. In addition, at least one wire 302 can be removed, respectively added, without the need to modify the electric line 202, or the cable sleeve 406.

The signal conditioner 204 comprises the line, or the interface, 312 taking the voltage $V_G$ received by the signal conditioner 204 to the shielding layer 402, so that said shielding layer 402 is polarized at said guard potential $V_G$.

Thus, the electric wires 302, surrounded by the shielding layer 402, are guarded at the guard potential $V_G$ and cannot be seen by the measurement electrodes $108_1$-$108_n$.

In the example shown, the shielding layer 402 is present on the electric line 202 only on one side of the signal conditioner 204, at the output of this signal conditioner. It can of course also be present on the electric line 202 on the other side of the signal conditioner, at the input. In this case, it can be:
- either also connected to the guard potential $V_G$;
- or connected to another potential such as ground, or electrically floating, in which case it is interrupted electrically at the level of the signal conditioner 204 between the input and the output.

Optionally, the electric line 202 can comprise one or more measurement electrodes arranged on an outer surface of the cable sleeve 406 and connected to capacitive detection electronics.

Figure 5:
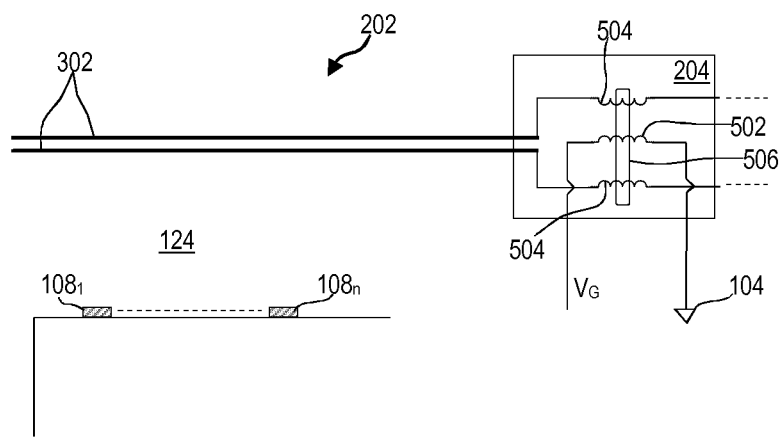

FIG. 5 is a diagrammatic representation of a third embodiment of setting an electric line at the guard potential in an appliance according to the invention.

In the example shown in FIG. 5, the line 202 comprises the electric wires 302 used for conveying electrical signals, for example in order to supply an electrical component part or in order to communicate with an electrical or electronic component part.

In the example shown in FIG. 5, the signal conditioner 204 comprises:
- a primary inductance 502 supplied with power by the potential $V_G$ or by a potential proportional to $V_G$; and
- for each electric wire 302, a secondary inductance 504 in series with said electric line 302.

Each of the inductances 502-504 can be formed by a coil for example.

The primary inductance 502 is in inductive coupling with each of the secondary inductances 504, so as to generate the potential $V_G$ by inductive coupling at the level of each of the secondary inductances 504. The potential $V_G$ generated at the level of each secondary inductance 504 is thus added, or superposed, on the electrical signal conveyed by the electric line 302 to which said secondary inductance 504 is connected. More precisely, a voltage source $V_G$, or a Thévenin generator, is thus inserted in series on all the electric lines 302.

Thus, each electric line 302 at the output of the signal conditioner 204 is polarized (with respect to ground) at the guard potential $V_G$ and is thus not seen by the measurement electrodes $108_1$-$108_n$.

It should be noted that the signals conveyed by the electric lines 302 in addition to the guard potential $V_G$ do not interfere with the capacitive measurement provided that they have no component (or at least no detectable component) at the measurement frequency.

Furthermore, the potential of the electric lines 302 is not affected at the input of the signal conditioner, therefore the signal conditioner 204 has no influence on the electronics located upstream of this signal conditioner.

This embodiment requires that the sum of the currents in the electric lines 302 is zero. This condition is fulfilled provided that the ground or the reference potential of the electronics downstream of the signal conditioner is also transmitted by an electric line 302, which is generally the case in practice for reasons of electrical protection of the tools.

Moreover, in this case, the signal conditioner 204 has no influence on the electronics, which are located downstream of this signal conditioner, since the potential differences between the electric lines 302 are all preserved.

Preferably, the primary inductance 502 and the secondary inductances 504 are wound on a common ferromagnetic core 506, so as to optimize the couplings by mutual inductance. The assembly thus forms a transformer. The potential applied to the primary inductance 502 is chosen so as to generate potentials $V_G$ in the secondary inductances 504, taking account of the actual inductive couplings.

The electric line 202 in FIG. 5 does not comprise anything more than the electric wires 302. Optionally, according to alternatives (not shown), the electric line 202 can comprise:
- the insulation layer 404, for example in the case where the electric line 202 comprises, or is formed by, a cable sleeve through which the electric wires 302 are passed;
- the insulation layer 306 and/or the insulation layer 308, for example in the case where the electric line 202 comprises, or is formed by, an electric cable comprising the electric wires 302.

Furthermore, the signal conditioner 204 in FIG. 5 can be used in each of the examples described with reference to FIGS. 3 and 4.

According to yet another alternative, when the electric line comprises concentric electric conductors/wires, it is sufficient to polarize only the outer electric wire at the guard potential. In this case, the signal conditioner can comprise a secondary inductance for the outer wire only.

Figure 6:
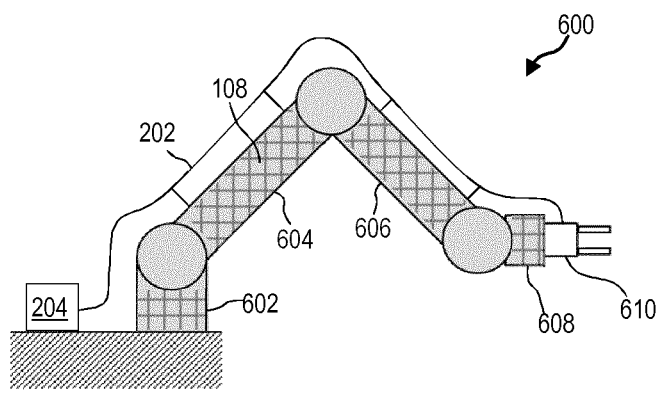
FIG. 6 is a diagrammatic representation of a non-limitative embodiment of a robot according to the invention.

FIG. 6 is a diagrammatic representation of a non-limitative embodiment of a robot according to the invention.

The robot 600, shown in FIG. 6, is a robotized arm such as an industrial collaborative robot working under the supervision of, or in collaboration with, an operator, or also a medical robot in the case of a surgical operation on the body of a person, or also a personal assistance robot.

The robotized arm 600 comprises a fixed segment 602, three articulated segments 604-608 and a functional head 610 fixed to the segment 608. The functional head 610 is a gripper equipped with an electric motor (not shown).

Each segment 602-608 is equipped with measurement electrodes 108 in order to carry out a capacitive detection of objects located in the environment of the robotized arm 600, in particular placed in/on the outer case of said segment.

The robotized arm 600 comprises a line 202 in order to supply power to the functional head and/or in order to communicate with the functional head and a signal conditioner 204 in order to apply a guard potential to the line 202 according to any one of the examples described with reference to FIGS. 3-5.

The signal conditioner 204 can be independent of the robotized arm 600.

Alternatively, the signal conditioner 204 can be integrated in the robotized arm 600, or in electronics of the robotized arm.

Alternatively, the signal conditioner 204 can be integrated in capacitive detection electronics equipping the robotized arm 600.

Of course, the invention is not limited to the examples which have just been described and numerous adjustments can be made to these examples without exceeding the scope of the invention.

The invention claimed is:

1. An appliance comprising:
   at least one electrode, called measurement electrode, polarized at an alternating electrical potential (VG), called detection electrical potential, different from a ground potential, at a frequency, called detection frequency, in order to detect at least one object in a detection zone;
   at least one capacitive detection electronics, connected to said at least one measurement electrode, in order to detect a signal with respect to a coupling capacitance between said object and said measurement electrode; and an electric line comprising at least one electric wire, in said detection zone;

said appliance also comprising a signal conditioner, applying, to at least a portion of said electric line, an alternating electrical potential (VG), called guard potential, identical to said detection potential at said detection frequency;

said electric line being located in said detection zone on a side of said measurement electrodes opposite to at least one guard electrode.

2. The appliance according to claim 1, characterized in that the electric line comprises at least one shielding layer around at least one electric wire on at least a portion of said electric line, the signal conditioner applying the guard potential (VG) to said shielding layer.

3. The appliance according to claim 2, characterized in that the shielding layer is provided in a cable comprising the at least one electric wire.

4. The appliance according to claim 3, characterized in that the shielding layer is in the form of braided wires forming a shielding braid.

5. The appliance according to claim 3, characterized in that the shielding layer is in the form of a continuous conductive layer.

6. The appliance according to claim 2, characterized in that the shielding layer is provided in, or is formed by, a cable sleeve independent of the at least one electric wire, and through which is passed the at least one electric wire.

7. The appliance according to claim 2, characterized in that the signal conditioner comprises a transformer inducing the guard potential (VG) on said shielding layer, by mutual inductance.

8. The appliance according to claim 2, characterized in that the signal conditioner comprises at least one electrical contact with the shielding layer in order to polarize said shielding layer at the guard potential (VG).

9. The appliance according to claim 1, characterized in that the signal conditioner applies the guard potential (VG) to at least one, in particular each, electric wire of the electric line.

10. The appliance according to claim 9, characterized in that the electric line comprises concentric electric wires, and the signal conditioner applies the guard potential (VG) to the outer wire only.

11. The appliance according to claim 9, characterized in that the signal conditioner comprises, for at least one, in particular each, electric wire, a transformer inducing the guard potential on said electric wire by mutual inductance.

12. The appliance according to claim 1, wherein said at least one guard electrode is polarized at the guard potential (VG), and arranged on the side opposite the detection zone with respect to the at least one measurement electrode.

13. The appliance according to claim 1, characterized in that the electric line comprises at least one capacitive measurement electrode polarized at the detection potential, arranged on the outside with respect to the portion of said electric line polarized at the guard potential (VG), and isolated from said portion polarized at the guard potential.

14. The appliance according to claim 1, characterized in that the electric line is an electric power supply line for, and/or for communication with, an electric component part of said appliance.

15. The appliance according to claim 1, characterized in that it is a robot in one of the following forms: robotized arm, mobile robot, vehicle on wheels or tracks, robot of the humanoid, or gynoid, or android type.

* * * * *